United States Patent [19]
Chou et al.

[11] Patent Number: 5,548,251
[45] Date of Patent: Aug. 20, 1996

[54] HIGH-FREQUENCY CLOCK GENERATOR USING LOWER FREQUENCY VOLTAGE CONTROLLED RING OSCILLATOR

[75] Inventors: Shu-Kuang Chou, Yungho; Jiunn-Fu Liou, Hsinchu, both of Taiwan

[73] Assignee: Electronics Research & Service Organization, Hsinchu, Taiwan

[21] Appl. No.: 493,549

[22] Filed: Jun. 23, 1995

[51] Int. Cl.⁶ .............................. H03B 5/02; H03B 27/00
[52] U.S. Cl. .................. 331/57; 331/45; 331/60; 331/177 R
[58] Field of Search ....................... 331/45, 57, 60, 331/177 R

[56] References Cited

U.S. PATENT DOCUMENTS

| | | | |
|---|---|---|---|
| 5,180,994 | 1/1993 | Martin et al. | 331/57 X |
| 5,428,318 | 6/1995 | Razavi | 331/57 |
| 5,436,939 | 7/1995 | Co et al. | 331/57 X |

Primary Examiner—Siegfried H. Grimm
Attorney, Agent, or Firm—Barnes, Kisselle, Raisch, Choate, Whittemore & Hulbert, P.C.

[57] ABSTRACT

A low noise high-frequency clock generator using a low speed voltage controlled oscillator which includes 2m differential delay elements connected in series in an inverting configuration, where m is an integer greater than 0. The output of the 2mth delay element is coupled to the input of the first delay element in a non-inverting configuration. M 2-input exclusive NOR gates are provided wherein respective input pairs are taken from positive terminal inputs of adjacent delay elements. The clock generator also includes an m-input OR gate coupled to the m-outputs from the respective m exclusive NOR gates for generating the clock generator output signal. The delay elements have a variable delay associated therewith controlled by a control delay signal DCS. Changes in the delay associated with each delay element changes the frequency of the clock generator output signal wherein the output frequency is equal to 1/(2d), where d is the time delay associated with each delay element.

7 Claims, 3 Drawing Sheets

HIGH-FREQUENCY CLOCK GENERATOR USING LOWER FREQUENCY VOLTAGE CONTROLLED RING OSCILLATOR

FIELD OF THE INVENTION

The present invention relates generally to a high-frequency clock generator, and, more particularly relates to a high-frequency clock generator having a low-frequency voltage controlled oscillator.

BACKGROUND OF THE INVENTION

Investigation into methods of generating digital waveforms have been under way for some time. In particular, it is conventional practice to employ a voltage controlled oscillator (VCO) to generate such a waveform. Referring now to FIG. 1, a prior art voltage controlled oscillator 10 is shown. Oscillator 10 is constructed by connecting an odd number of inverters 12 in series into a loop to form oscillator 10. As shown in FIG. 2, when the voltage at node a goes from a logic low to a logic high, node b transitions from a logic high to a logic low state after a time delay of d. Similarly, the above-described transition will cause node c to transition from a logic low to a logic high after a time delay of d. This structure is conventionally known as a ring oscillator, and its output is taken with reference to node a. Thus, the output frequency of the oscillator 10 is the same as the oscillating frequency of any of the individual inverters 12 in the loop. It should be appreciated that when such a structure is constructed using CMOS devices, sudden surges of power consumption are observed at every gate transition (i.e., from a logic low to a logic high, or, from a logic high to a logic low). Therefore, oscillator 10 results in high-frequency harmonic noise on the power source line. For example, oscillator 10 has an output frequency of $f_{VCO}=1/(6d)$, where d is the time delay associated with inverter 12, which may, for example, be 10 nanoseconds. However, transitions occur every d seconds generating a harmonic having a frequency of three times the output frequency (i.e., $f_{VCO}=\frac{1}{2}d$). This odd high-frequency harmonic noise on the power source line is undesirable.

Furthermore, since the loop frequency and the oscillator output frequency are the same, the output frequency is limited by the number of inverters used. Moreover, the output frequency of oscillator 10 is limited by the delay time d associated with individual inverters 12 such that the maximum frequency, $f_{max}$, is equal to $\frac{1}{2}md$, where m is the number of inverter elements used.

The present invention is directed to overcoming one or more of the problems as set forth above.

SUMMARY OF THE INVENTION

This invention provides for low-noise operation and provides an output signal whose frequency is independent of the number of inverting elements used to form the base oscillator loop. Moreover, this invention provides a substantially higher upper operating frequency in so far as it relates to the time delay of an individual inversion element: i.e., $f_{max}=\frac{1}{2}d$, where d is the time delay of an individual inversion element. A low noise clock generator in accordance with the present invention includes 2m inversion elements connected in series, m comparison means, and conjunctive logic means. The 2m inversion elements form a loop, wherein each inversion element inverts its input signal after a preselected delay d. Each comparison means is responsive to a pair of input signals and includes an output for providing a logic 1 signal when the respective pair of input signals match (i.e., both are a logic low or both are a logic high). Each pair of input signals are taken from the inputs of adjacent inversion elements. The conjunctive logic means has m-inputs that are respectively coupled to the m outputs of the m comparison means. The output of the conjunctive logic means generating an oscillator output signal having a frequency equal to 2mf, where f is the frequency at which each of the 2m inversion elements oscillate.

In a preferred embodiment of the present invention, each inversion element comprises a differential delay element. The comparison means comprises an exclusive NOR gate, and the conjunctive logic means includes an m-input OR gate.

A clock generator in accordance with the present invention provides advantages over conventional clock generators, including elimination of noise on the power source line for higher order harmonic frequencies and an output frequency related only to the delay of the individual delay elements used, and not related to the number of such elements connected in series, and a higher upper frequency limit relative to the time delay d of the individual inversion element.

These and other features and objects of this invention will become apparent to one skilled in the art from the following detailed description and the accompanying drawings illustrating features of this invention by way of example.

DETAILED DESCRIPTION OF THE PREFERRED EMBODIMENT

Figure 3:
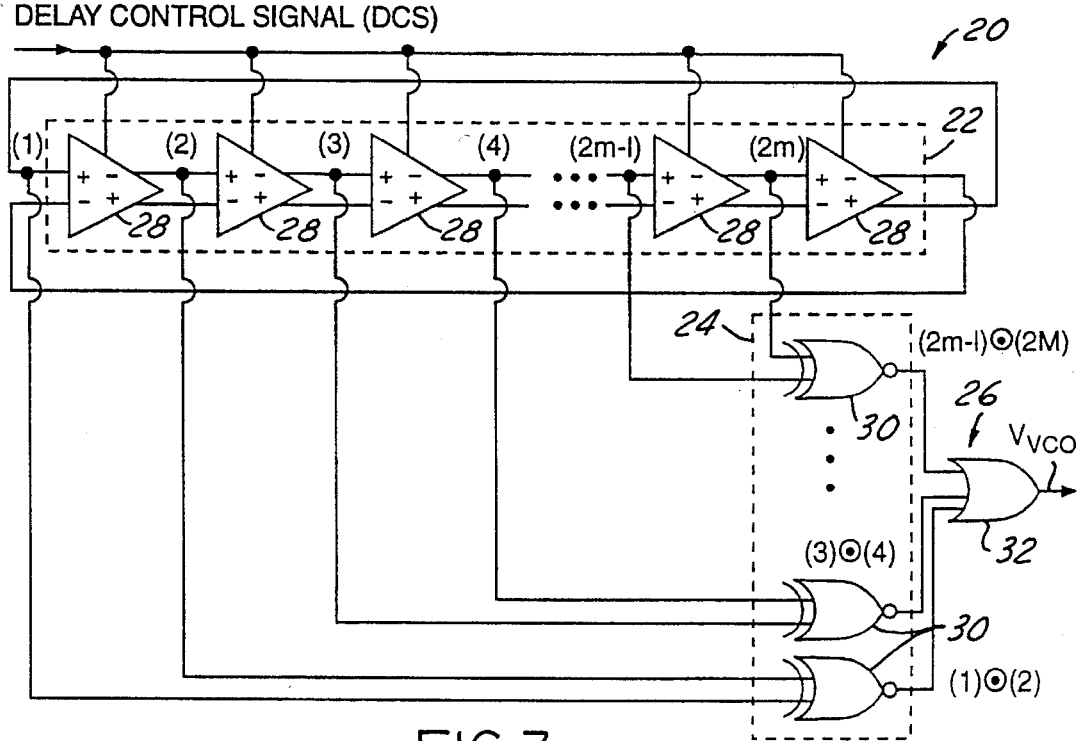
FIG. 3 is a partial schematic view of a clock generator having a low-frequency voltage controlled oscillator embodiment in accordance with the present invention.

FIG. 3 shows a high-frequency low-noise clock generator 20 having a low-frequency voltage controlled oscillator. Clock generator 20 includes an even number 2m inversion delay elements 22 connected in series, where m is an integer greater than 0, m comparison means 24, and conjunctive logic means 26.

Inversion delay elements 22 are connected in series to define a loop for providing a plurality of loop frequency taps. Preferably, inversion delay elements take the form of differential delay elements 28, although alternate embodiments employing, for example, voltage controlled single-ended inverters may be constructed. Each one of the 2m delay elements 28 functions to invert a respective input signal presented on its positive (+) and negative (–) input terminals after a time delay of d, the inverted signal appearing on the negative (–) and positive (+) output terminals. The delay d associated with each delay element 28 is preferably variable in accordance with the magnitude of a voltage associated with a delay control signal (DCS). Differential delay element 28 is well known to those of ordinary skill in the art.

As described above, the 2m differential delay elements 28 are connected in series in an inverting configuration, with the output of the 2mth differential delay element 28 being coupled to the input of the first differential delay element in a non-inverting configuration.

The m comparison means 24 each has a pair of inputs coupled to the respective inputs of adjacent ones of the 2m delay elements 28 for providing a logic 1 (or high) signal when a respective pair of inputs match (i.e., when both of the inputs are either a logic low or 0, or, both of the inputs are a logic high or 1). Preferably, each one of the m comparison means comprises an exclusive NOR gate 30, wherein each pair of input signals are taken from the positive input terminal (+) (i.e., the above-referenced loop frequency taps) of adjacent differential delay elements 28.

Conjunctive logic means 26 is provided for generating an oscillator output signal $V_{VCO}$ in response to the m outputs of the respective m exclusive NOR gates 30. Preferably, conjunctive logic means 26 comprises an m-input OR gate.

Figure 4:
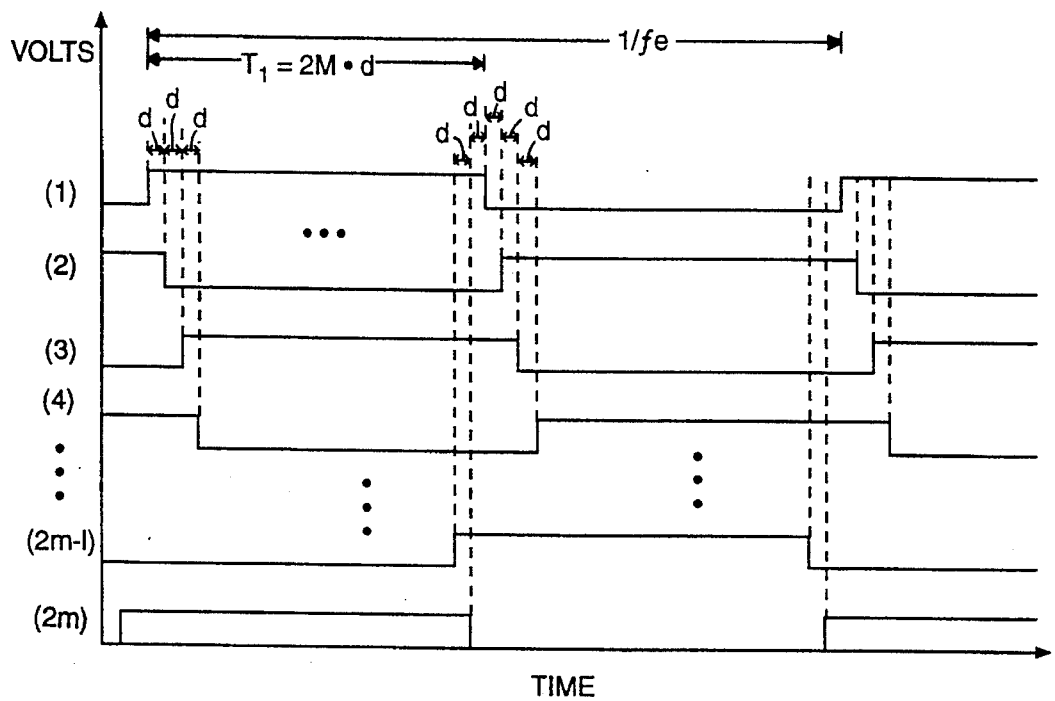
FIG. 4 is a simplified timing diagram depicting the output waveforms of each of the delay elements included in the clock generator shown in FIG. 3.

As shown in FIG. 4, each of the differential delay elements 28 oscillates at a frequency $f_e$ when configured as shown in FIG. 3:

$$f_e = 1/(2T_1) \quad (1)$$

where $f_e$=the oscillation frequency of each delay element 28; and, $T_1$=½ the oscillation period of each element 28.

It should be appreciated that the oscillating frequency of each element 28 is also the oscillating frequency of the complete loop. From the architecture shown in FIG. 3, the loop frequency is a function of m and d, wherein:

$$T_1 = 2m*d \quad (2)$$

where $T_1$=½ the oscillating period of each element 28, and also ½ the oscillating period of the complete loop, 2m=the number of delay elements 28, and, d=the delay time of each delay element 28 controlled as a function of signal DCS.

Combining equations (1), and (2), we obtain the oscillating frequency $f_e$ for each delay element 28 (and also of the complete loop):

$$f_e = \frac{1}{2*2m*d} = \frac{1}{4m*d} \quad (3)$$

The output waveforms of each of the 2m delay elements 28 in clock generator 20 are depicted in FIG. 4.

Figure 5:
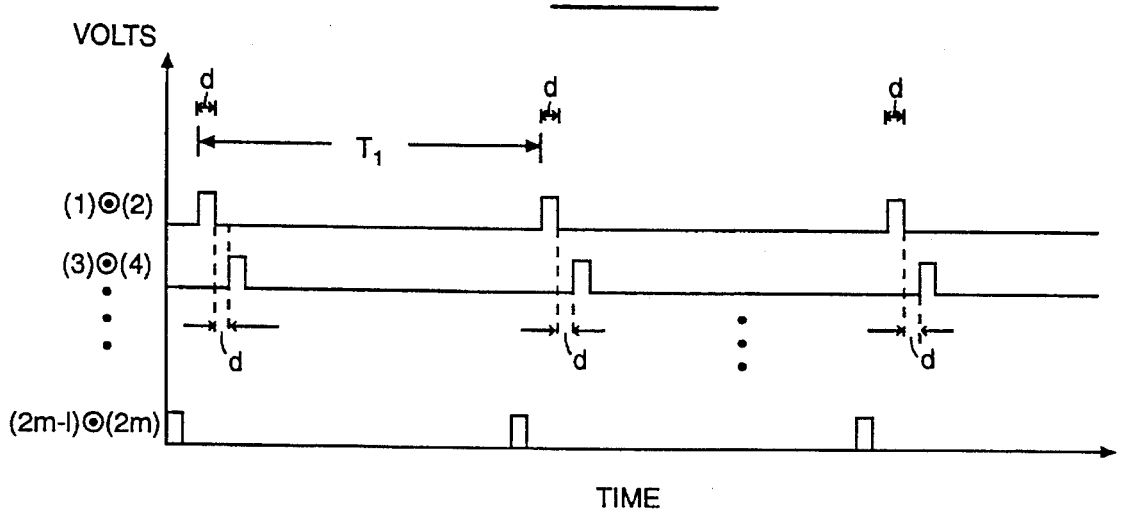
FIG. 5 shows a simplified timing diagram depicting the output waveforms for each of the comparison means included in the clock generator of FIG. 3.

In FIG. 5, the output signals of the m exclusive NOR gates 30 are shoe.

Figure 6:
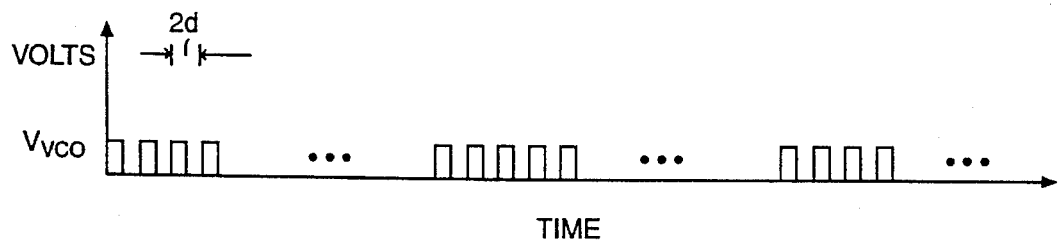
FIG. 6 is a graph showing the output waveform of the clock generator circuit shown in FIG. 3.

In FIG. 6, the output of the clock generator 20, which is generated by OR gate 32, is shown as a continuous pulse stream having a period of 2d. Accordingly, the frequency of clock generator 20 is defined as follows:

$$f_{VCO} = \frac{1}{2d} \quad (4)$$

It should be understood from equation (4) that the frequency is independent of the number of delay elements 2m used in the low-frequency VCO loop, and is only dependent upon the delay d associated with each delay element 28. Since the delay d is controlled by delay control signal DCS, the generator 20 output frequency is also continuously variable as a function of signal DCS. Alternatively, the frequency of generator 20 output signal $V_{VCO}$ may be written as the product of the number of delay elements and the oscillating frequency of each element by combining equations (3) and (4) above:

$$f_{VCO} = 2mf_e$$

where $f_{VCO}$=the oscillating frequency of generator 20 output signal $V_{VCO}$, 2m=the number of delay elements 28; and, $f_e$=the oscillating frequency of each delay element 28 (i.e., equal to the loop frequency).

Figures 7A, 7B:
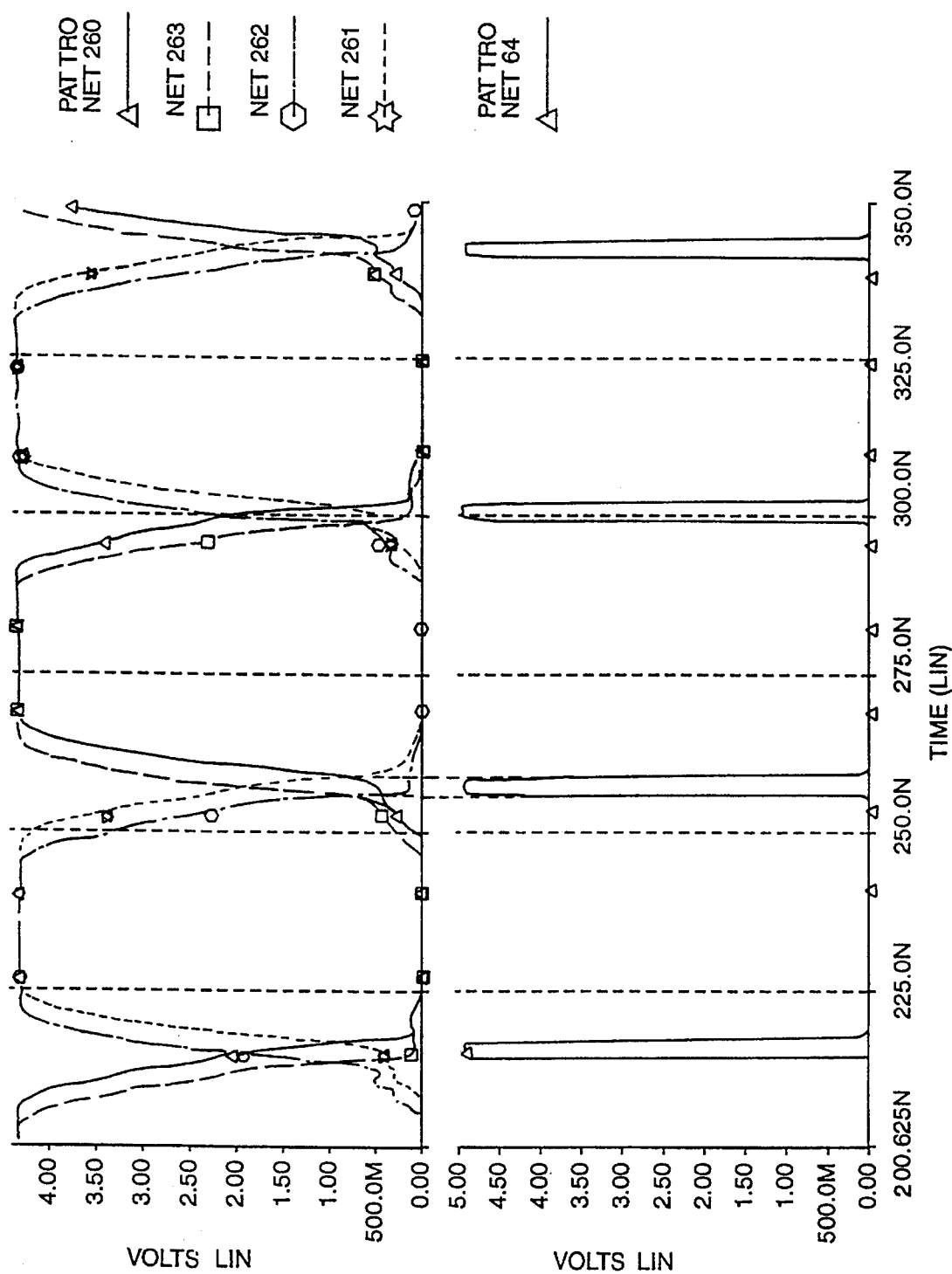
FIG. 7A is partial voltage versus time timing diagram depicting the simulated output of selected delay elements of an embodiment of the present invention having 14 delay elements (m=7).
FIG. 7B is a partial voltage versus time timing diagram depicting the simulated output of selected exclusive NOR gates of the embodiment referenced in FIG. 7A.

FIGS. 7A and 7B respectively depict the simulated outputs of selected differential delay elements 28, and exclusive NOR gates 30.

Figure 1:
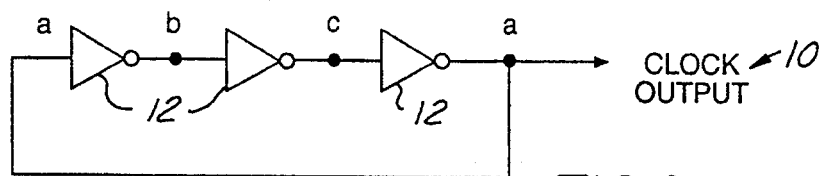
FIG. 1 is a partial schematic view of a prior art clock generator.
Figure 2:
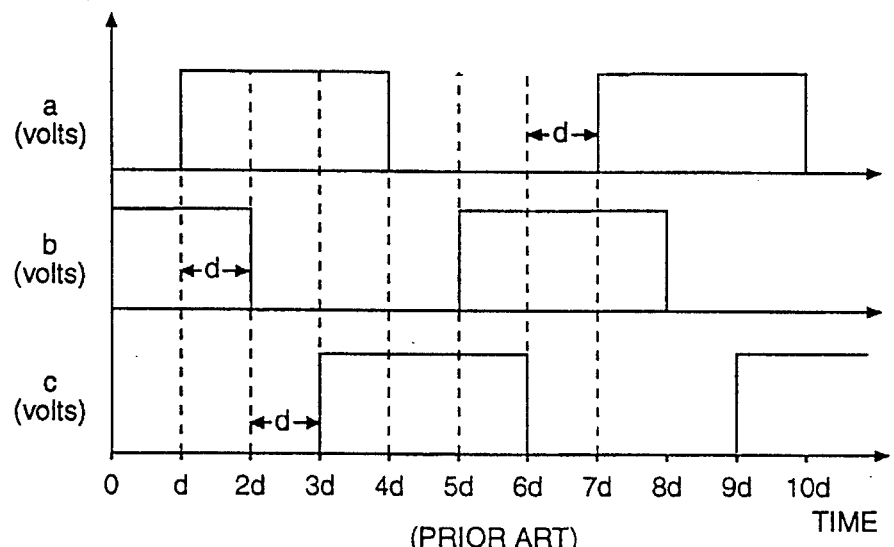
FIG. 2 is a simplified timing diagram showing the output waveforms of each of the delay elements shown in the prior art clock generator of FIG. 1.

It should be appreciated from the above description and FIGS. 4, 5, and 6 that the oscillations of output signal $V_{VCO}$ coincide with the individual element 28 and exclusive NOR gate 30 transitions. Accordingly, noise generated on the power source line is synchronized with the generated output clock signal $V_{VCO}$. Accordingly, there exists no higher frequency harmonics in a clock generator in accordance with the present invention. For a selected output frequency, the loop frequency associated with the present invention, as compared with a conventional clock generator, is smaller. For example, in the prior art clock generator 10, as shown in FIG. 1, when the output frequency is 30 MHz, the loop frequency is also 30 MHz. In contrast, the loop frequency of a high speed clock generator using a low speed VCO in accordance with the present invention is 30 MHz divided by 2m, where 2m is the number of delay elements 28. The greater the number of delay elements 28 employed, the lower the loop frequency can be without affecting the output frequency $f_{VCO}$.

A high speed, low noise clock generator in accordance with the present invention has significant advantages over conventional clock generator design. Since the transitions occurring in the individual delay elements 28, and gating logic 30, coincide with the transition edges of the output signal $V_{VCO}$, the power source line does not have noise that is of a higher frequency than the oscillator output frequency, $f_{VCO}$. A clock generator in accordance with the present invention, such as generator 20, has an output frequency $f_{VCO}$ equal to $2mf_e$ such that the loop frequency is always smaller than the output frequency by a factor of 2m. Further, the output frequency $f_{VCO}$ is only related to the delay time d of delay elements 28, and is not related to the number of such delay elements connected in series. Finally, the upper limit output frequency, relative to a delay time d of the delay elements employed, is much greater than that found in the prior art.

The preceding description is exemplary rather than limiting in nature. A preferred embodiment of this invention has been disclosed to enable one skilled in the art to practice this invention. Variations and modifications are possible without departing from the purview and spirit of this invention; the scope of which is limited only by the appended claims.

What is claimed is:

1. A low noise clock generator, comprising:

2m inversion elements connected in series, where m is an integer greater than zero, each inversion element inverting a respective input signal after a preselected delay d, an input of a first one of said 2m inversion elements being coupled to an output of a 2mth inversion element;

m comparison means each having first and second inputs, each said first and second inputs being respectively coupled to adjacent inversion elements, each one of said m comparison means having an output for providing a logic one signal when said respective first and second inputs match; and conjunctive logic means responsive to said m comparison means for generating an oscillator output signal having a frequency defined as a function of d.

2. The oscillator of claim 1, wherein at least one of said inversion element comprises a differential delay element.

3. The oscillator of claim 1 wherein at least one of said m comparison means comprises an exclusive NOR gate.

4. The oscillator of claim 1 wherein said conjunctive logic means comprises an m-input OR gate.

5. The oscillator of claim 1 wherein each inversion element is responsive to a voltage control signal for varying said delay d, wherein said delay d is selected as a function of a magnitude of said voltage control signal to thereby vary said oscillator output signal frequency.

6. A low noise clock generator for generating an output signal having a variable frequency using a control signal, comprising:

2m differential delay elements each coupled to said control signal for inverting a respective input signal and being of the type having a delay d, said delay elements being connected in series in an inverting configuration, an output of a 2mth one of said delay elements being coupled to an input of a first one of said delay elements in a non-inverting configuration, said delay d being variable as a function of a voltage of said control signal;

m exclusive NOR gates each having first and second inputs, each one of said m first and second inputs being respectively coupled to adjacent delay elements, each exclusive NOR gate providing a logic one output signal when said respective first and second inputs match; and, an m-input OR gate responsive to said m exclusive NOR gates for generating said generator output signal having a frequency defined as a function of d.

7. The generator of claim 6 wherein said generator output signal has a frequency value computed according to the following equation:

$$f_{VCO} = 1/(2*d)$$

where:

$f_{VCO}$ = clock generator output frequency value; and, d = a time delay associated with each differential delay element.

* * * * *

UNITED STATES PATENT AND TRADEMARK OFFICE
CERTIFICATE OF CORRECTION

PATENT NO. : 5,548,251
DATED : August 20, 1996
INVENTOR(S) : SHU-KUANG CHOU and JIUNN-FU LIOU It is certified that error appears in the above-indentified patent and that said Letters Patent is hereby corrected as shown below:

Abstract:

Line 5, delete "2mth" and substitute --2m$\underline{th}$--

Column 3, Line 17, delete "2mth" and substitute --2m$\underline{th}$--.

Column 3, Line 67, delete "shoe" and substitute --shown--.

Column 5, Line 11, delete "2mth" and substitute --2m$\underline{th}$--.

Column 6, Line 8, delete "2mth" and substitute --2m$\underline{th}$--.

Signed and Sealed this

Third Day of June, 1997

Attest:

BRUCE LEHMAN

*Attesting Officer*     *Commissioner of Patents and Trademarks*